United States Patent
Lin et al.

(10) Patent No.: US 10,242,737 B1
(45) Date of Patent: Mar. 26, 2019

(54) DEVICE STRUCTURE FOR NEUROMORPHIC COMPUTING SYSTEM

(71) Applicant: MACRONIX INTERNATIONAL CO., LTD., Hsinchu (TW)

(72) Inventors: Yu-Yu Lin, Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/895,369

(22) Filed: Feb. 13, 2018

(51) Int. Cl.
G11C 13/00 (2006.01)
H01L 27/24 (2006.01)
G06N 3/063 (2006.01)
H01L 45/00 (2006.01)

(52) U.S. Cl.
CPC ........... *G11C 13/004* (2013.01); *G06N 3/063* (2013.01); *H01L 27/2436* (2013.01); *H01L 27/2463* (2013.01); *H01L 45/16* (2013.01); *G11C 13/0069* (2013.01); *G11C 2213/79* (2013.01)

(58) Field of Classification Search
CPC .............. G11C 13/002; G11C 13/0002; G11C 13/0004; G11C 13/0021; G11C 13/0069; G06N 3/063; H01L 27/2436; H01L 27/2463; H01L 45/16
USPC .................................. 365/63, 148, 158, 163
See application file for complete search history.

(56) References Cited

U.S. PATENT DOCUMENTS

| | | | |
|---|---|---|---|
| 4,219,829 A | 8/1980 | Dorda et al. | |
| 5,586,073 A | 12/1996 | Hiura et al. | |
| 6,107,882 A | 8/2000 | Gabara et al. | |
| 6,829,598 B2 | 12/2004 | Milev | |
| 6,906,940 B1 | 6/2005 | Lue | |
| 6,960,499 B2 | 11/2005 | Nandakumar et al. | |
| 7,368,358 B2 | 5/2008 | Ouyang et al. | |

(Continued)

FOREIGN PATENT DOCUMENTS

| | | |
|---|---|---|
| WO | 2012015450 A1 | 2/2012 |
| WO | 2017091338 A1 | 6/2017 |

OTHER PUBLICATIONS

Schuller et al., "Neuromorphic Computing: From Materials to Systems Architecture," US Dept. of Energy, Oct. 29-30, 2015, Gaithersburg, MD, 40 pages.

(Continued)

*Primary Examiner* — Tan T. Nguyen
(74) *Attorney, Agent, or Firm* — Haynes Beffel & Wolfeld LLP (57) ABSTRACT

An array of resistance cells has a number M of rows and a number N of columns of resistance cells. Each cell comprises a transistor having a threshold, representing a weight factor $W_{nm}$ of the cell, and a resistive element in series with the transistor. Each cell has a cell resistance having a first value when the transistor is on and a second value when the transistor is off. A set of source lines is coupled to the resistance cells in respective columns. A set of bit lines is coupled to the resistance cells in respective rows, signals on the bit lines representing inputs x(m) to the respective rows. A set of word lines is coupled to gates of the transistors in the resistance cells in respective columns. Current sensed at a particular source line represents a sum of products of the inputs x(m) by respective weight factors $W_{nm}$.

20 Claims, 11 Drawing Sheets

(56) References Cited

U.S. PATENT DOCUMENTS

| | | | |
|---|---|---|---|
| 8,203,187 | B2 | 6/2012 | Lung et al. |
| 8,275,728 | B2 | 9/2012 | Pino |
| 8,432,719 | B2 | 4/2013 | Lue |
| 8,451,647 | B2 * | 5/2013 | Ishihara ............ G11C 13/0007 365/148 |
| 8,589,320 | B2 | 11/2013 | Breitwisch et al. |
| 8,630,114 | B2 | 1/2014 | Lue |
| 8,860,124 | B2 | 10/2014 | Lue et al. |
| 9,064,903 | B2 | 6/2015 | Mitchell et al. |
| 9,431,099 | B2 | 8/2016 | Lee et al. |
| 9,589,982 | B1 | 3/2017 | Cheng et al. |
| 9,698,156 | B2 | 7/2017 | Lue |
| 9,698,185 | B2 | 7/2017 | Chen et al. |
| 9,710,747 | B2 | 7/2017 | Kang et al. |
| 10,055,383 | B1 * | 8/2018 | Shafiee Ardestani ... G06F 17/16 |
| 2003/0122181 | A1 | 7/2003 | Wu |
| 2005/0287793 | A1 | 12/2005 | Blanchet et al. |
| 2010/0182828 | A1 | 7/2010 | Shima et al. |
| 2010/0202208 | A1 | 8/2010 | Endo et al. |
| 2011/0063915 | A1 | 3/2011 | Tanaka et al. |
| 2011/0106742 | A1 | 5/2011 | Pino |
| 2011/0286258 | A1 | 11/2011 | Chen et al. |
| 2012/0044742 | A1 | 2/2012 | Narayanan |
| 2012/0235111 | A1 | 9/2012 | Osano et al. |
| 2013/0075684 | A1 | 3/2013 | Kinoshita et al. |
| 2014/0268996 | A1 | 9/2014 | Park |
| 2016/0181315 | A1 | 6/2016 | Lee et al. |
| 2016/0308114 | A1 | 10/2016 | Kim et al. |
| 2016/0336064 | A1 | 11/2016 | Seo et al. |
| 2017/0069373 | A1 * | 3/2017 | Sugimoto ............ G11C 13/004 |
| 2017/0092370 | A1 | 3/2017 | Harari |
| 2017/0148517 | A1 | 5/2017 | Harari |

OTHER PUBLICATIONS

U.S. Appl. No. 15/873,369, filed Jan. 17, 2018, entitled "Sum-Of-Products Accelerator Array," Lee et al., 52 pages.

U.S. Appl. No. 15/887,166, filed Feb. 2, 2018, entitled "Sum-Of-Products Array for Neuromorphic Computing System," Lee et al., 49 pages.

U.S. Appl. No. 15/922,359, filed Mar. 15, 2018, entitled "Voltage Sensing Type of Matrix Multiplication Method for Neuromorphic Computing System," Lin et al., 40 pages.

EP Extended Search Report from 18155279.5-1203 dated Aug. 30, 2018, 8 pages.

EP Extended Search Report from EP18158099.4 dated Sep. 19, 2018, 8 pages.

Soudry, et al. "Hebbian learning rules with memristors," Center for Communication and Information Technologies CCIT Report #840, Sep. 1, 2013, 16 pages.

* cited by examiner

DEVICE STRUCTURE FOR NEUROMORPHIC COMPUTING SYSTEM

BACKGROUND

Field

The present invention relates to circuitry that can be used to perform sum-of-products operations.

Description of Related Art

In neuromorphic computing systems, machine learning systems and circuitry used for some types of computation based on linear algebra, the sum-of-products function can be an important component. The function can be expressed as follows:

$$f(x_i) = \sum_{i=1}^{M} W_i x_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function.

For high-speed implementations, it is desirable to have a very large array so that many operations can be executed in parallel, or very large sum-of-products series can be performed. In the systems, there can be a very large number of inputs and outputs, so that the total current consumption can be very large.

It is desirable to provide structures for sum-of-products operations suitable for implementation in large arrays, and that can be more energy-efficient.

SUMMARY

A device is described that comprises an array of resistance cells having a number M of rows and a number N of columns of resistance cells. Resistance cells in the array each comprise a transistor having a threshold, representing a weight factor $W_{nm}$ of the cell, and a resistive element in series with the transistor. The cell has a cell resistance having a first value when the transistor is on and a second value when the transistor is off.

Figure 7:
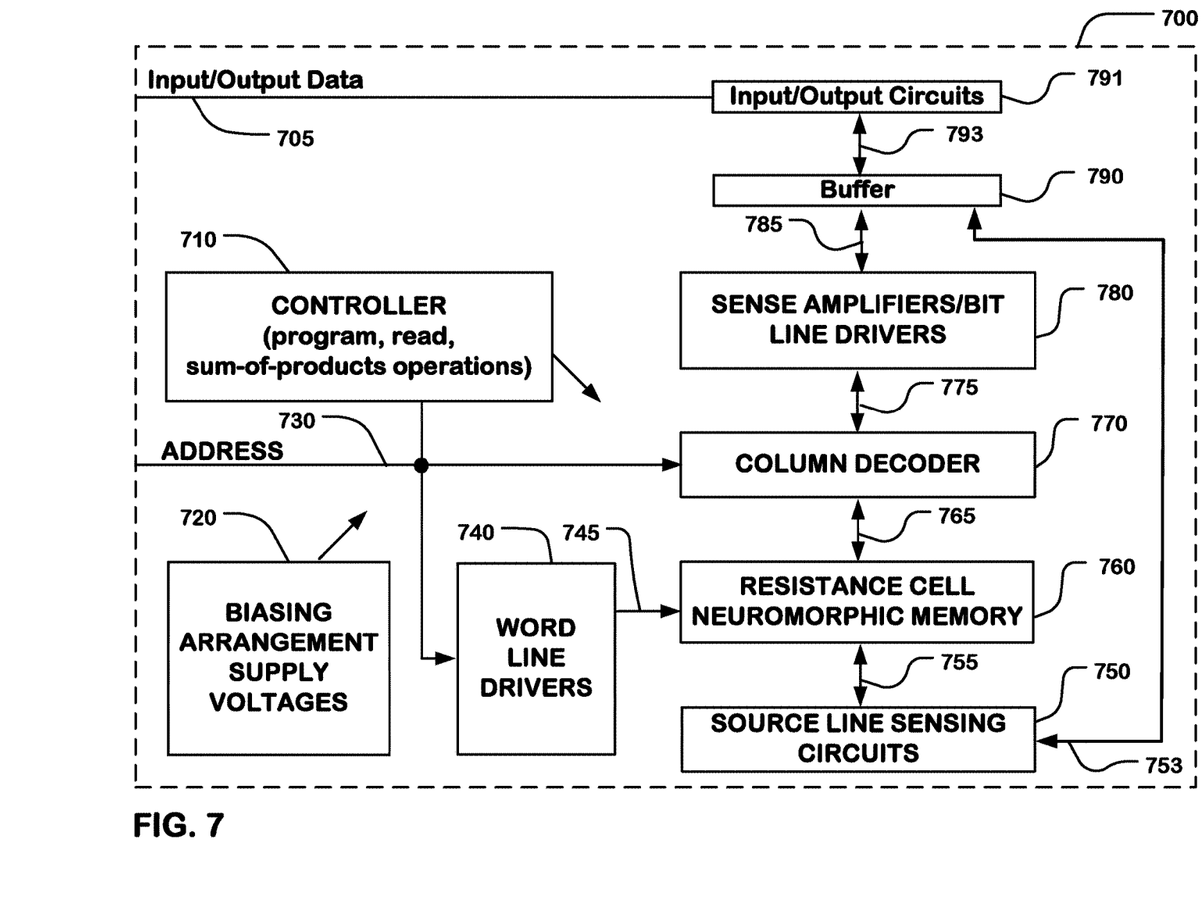
FIG. 7 is a simplified chip block diagram of an integrated circuit device including a neuromorphic memory array.

The device comprises peripheral circuits such as sense amplifiers (e.g. 780, FIG. 7). Transistors in the peripheral circuits have an on-resistance when the transistors in the peripheral circuits are on. The on-resistance of the transistors in the peripheral circuits is lower than the first value of the cell resistance of a resistance cell in the array of resistance cells when the transistor in the resistance cell is on.

A set of source lines is coupled to the resistance cells in respective columns of resistance cells. Source lines in the set of source lines can include a common source line coupled to resistance cells in two adjacent columns of resistance cells in the array of resistance cells. A set of bit lines is coupled to the resistance cells in respective rows of resistance cells, signals on the bit lines in the set of bit lines representing inputs x(m) to the respective rows. A set of word lines is coupled to gates of the transistors in the resistance cells in respective columns of resistance cells, signals on the word lines in the set of word lines selecting respective columns of resistance cells. A set of sensing circuits is coupled to respective source lines in the set of source lines. Current sensed at a particular source line in the set of source lines can represent a sum of products of the inputs x(m) by respective weight factors $W_{nm}$.

A bit line driver applies a predetermined operating bit line to source line voltage. The sensing circuits have a sensing current range having an upper value, wherein the first values of the resistances in the resistance cells in the array have a resistance value at least as high as a resistance determined by the predetermined operating bit line to source line voltage multiplied by the number M of rows and divided by the upper value in the predetermined sensing current range. Different sensing current ranges can be required for different device architectures. The first value of the cell resistance of the resistance cells in the array can be greater than 100 kilo-ohms.

Contacts are connected in series with current carrying terminals of the transistors of the resistance cells and corresponding bit lines, the contacts including interlayer conductors comprising a bulk material having a resistivity, and wherein the resistive elements comprise a layer of higher resistivity material in the contacts, the higher resistivity being higher than the resistivity of bulk material of the interlayer conductors. A bulk material as used herein can include conductive materials such as polysilicon having n-type or p-type doping, tungsten, titanium, other metals or metallic alloys and metallic materials such as TiN, TaN, Pt, W, etc.

Embodiments are described in which the resistive elements comprising the layer of higher resistivity material are disposed in a continuous resistive layer underlying and contacting the bit lines and overlying and contacting upper ends of the interlayer conductors.

Embodiments are described in which the resistive elements comprising the layer of higher resistivity material are disposed in a patterned resistive layer underlying and contacting the bit lines and overlying and contacting upper ends of the interlayer conductors.

Embodiments are described in which the resistive elements comprising the layer of higher resistivity material are disposed beneath and contacting lower ends of the interlayer conductors in a substrate. The device comprises peripheral circuits such as sense amplifiers (e.g. 780, FIG. 7) that have contacts in a substrate. Contacts of the peripheral circuits in a substrate have a lower resistance than the resistive elements comprising the layer of higher resistivity material in the resistance cells in the array of resistance cells.

Embodiments are described in which the resistive elements comprising the layer of higher resistivity material are disposed beneath the bit lines and above the interlayer conductors, the resistive elements having upper ends disposed beneath and contacting the bit lines, and lower ends disposed above and contacting upper ends of the interlayer conductors.

Embodiments are described in which the device comprises peripheral circuits including transistors having channel resistivities, and the resistive elements in the resistance cells comprise channel regions of the transistors in the resistance cells on a substrate. The channel regions of the transistors in the resistance cells have a channel resistivity that is higher than the channel resistivities of the transistors in the peripheral circuits.

In one embodiment, the transistors in the resistance cells in the array of resistance cells can include floating gate devices. In an alternative embodiment, the transistors in the resistance cells in the array of resistance cells can include dielectric charge trapping devices (e.g. SONOS, BE-SONOS, TANOS, MA BE-SONOS).

Methods for manufacturing a neuromorphic memory device as described herein is also provided.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
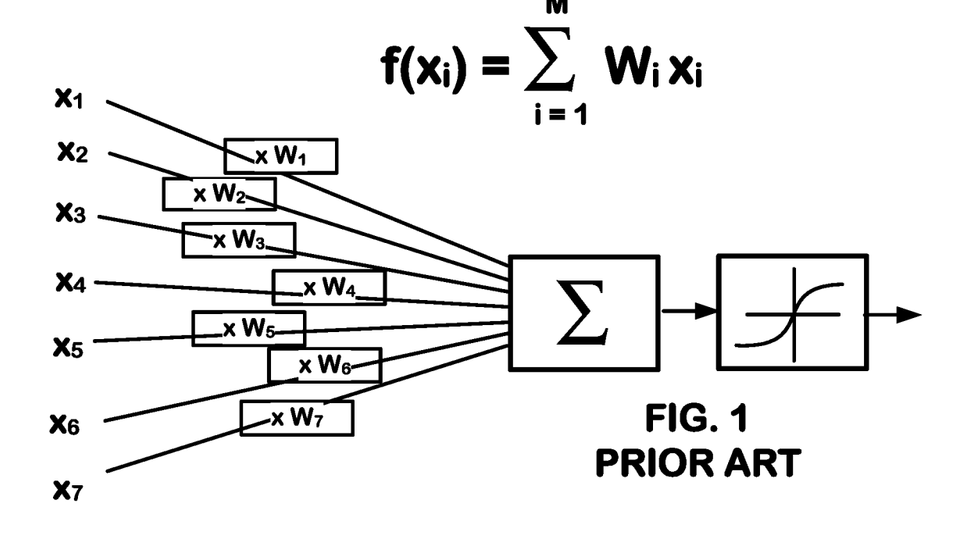
FIG. 1 is a diagram of a sum-of-products operation.

FIG. 1 is a diagram of a sum-of-products operation, where the terms of the summation are the product of input $X_i$ times a weight $W_i$, in this example, where i goes from 1 to 7. The weight $W_i$ can differ over the terms of the summation. In operation, the weights can be assigned as a set of coefficients, and then the inputs applied to compute a summation that changes as the inputs change. Also, in algorithms executing a learning procedure, the weights can be changed from time to time as the learning procedures change coefficients to learn from the summation that achieves a useable result.

In the illustrated example, the output of the summation is applied to a sigmoid function to produce an output that ranges in a non-linear fashion between a minimum and a maximum such as between 0 and 1. This is a common model of a synapse for example used in neuromorphic computing. Other activation functions can be used as well, such as a logit function. The sum-of-products operation can be applied as well in configurations not neuromorphic or not otherwise considered to model neurological systems.

Figure 2:
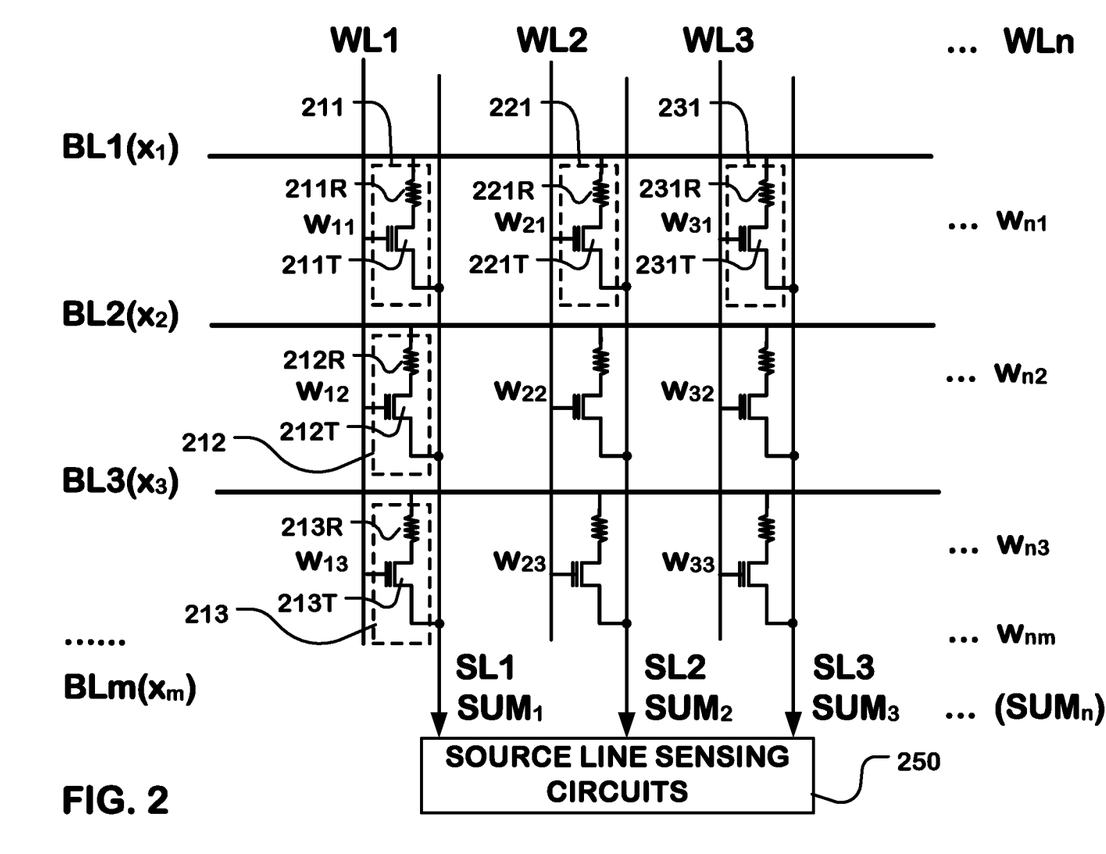
FIG. 2 illustrates an array of resistance cells having a number M of rows and a number N of columns of resistance cells, where a source line is coupled to resistance cells in one column of resistance cells.

FIG. 2 illustrates an array of resistance cells having a number M of rows and a number N of columns of resistance cells, where a source line is coupled to resistance cells in one column of resistance cells. Resistance cells in the array can each comprise a transistor having a threshold, representing a weight factor $W_{nm}$ of the cell, and a resistive element in series with the transistor. Each resistance cell can have a cell resistance having a first value when the transistor is on and a second value when the transistor is off. For instance, a row of resistance cells can include a first resistance cell 211 including a transistor 211T and a resistive element 211R connected in series with the transistor 211T, a second resistance cell 221 including a transistor 221T and a resistive element 221R connected in series with the transistor 221T, and a third resistance cell 231 including a transistor 231T and a resistive element 231R connected in series with the transistor 231T.

The device comprises peripheral circuits such as sense amplifiers (e.g. 780, FIG. 7). Transistors in the peripheral circuits have an on-resistance when the transistors in the peripheral circuits are on. The on-resistance of the transistors in the peripheral circuits is lower than the first value of the cell resistance of a resistance cell in the array of resistance cells when the transistor in the resistance cell is on.

Embodiments are described that include the resistive elements in the resistance cells in the array, in reference to FIGS. 5A, 5B, 5C, 5D and 5E. Resistive elements in the resistance cells in the array can include materials such as metal oxides, high resistive polysilicon, etc.

A set of source lines (e.g. SL1, SL2, SL3) is coupled to the resistance cells in respective columns of resistance cells. A set of bit lines (e.g. BL1, BL2, BL3, . . . BLm) is coupled to the resistance cells in respective rows of resistance cells. Signals on the bit lines in the set of bit lines can represent inputs x(m) to the respective rows. A set of word lines (e.g. WL1, WL2, WL3, . . . WLn) is coupled to gates of the transistors in the resistance cells in respective columns of resistance cells. Signals on the word lines in the set of word lines can select respective columns of resistance cells. A set of sensing circuits (e.g. 250) is coupled to respective source lines in the set of source lines.

Current (e.g. $SUM_1$, $SUM_2$, $SUM_3$, . . . $SUM_n$) sensed at a particular source line (e.g. SL1, SL2, SL3) in the set of source lines can represent a sum of products of the inputs x(m) by respective weight factors $W_{nm}$.

A bit line driver (e.g. in block 780, FIG. 7) can apply a predetermined operating bit line to source line voltage, and the sensing circuits can have a sensing current range having an upper value, wherein the first values of the resistances in the resistance cells in the array have a resistance value at least as high as a resistance determined by the predetermined operating bit line to source line voltage multiplied by the number M of rows and divided by the upper value in the predetermined sensing current range.

Figure 3:
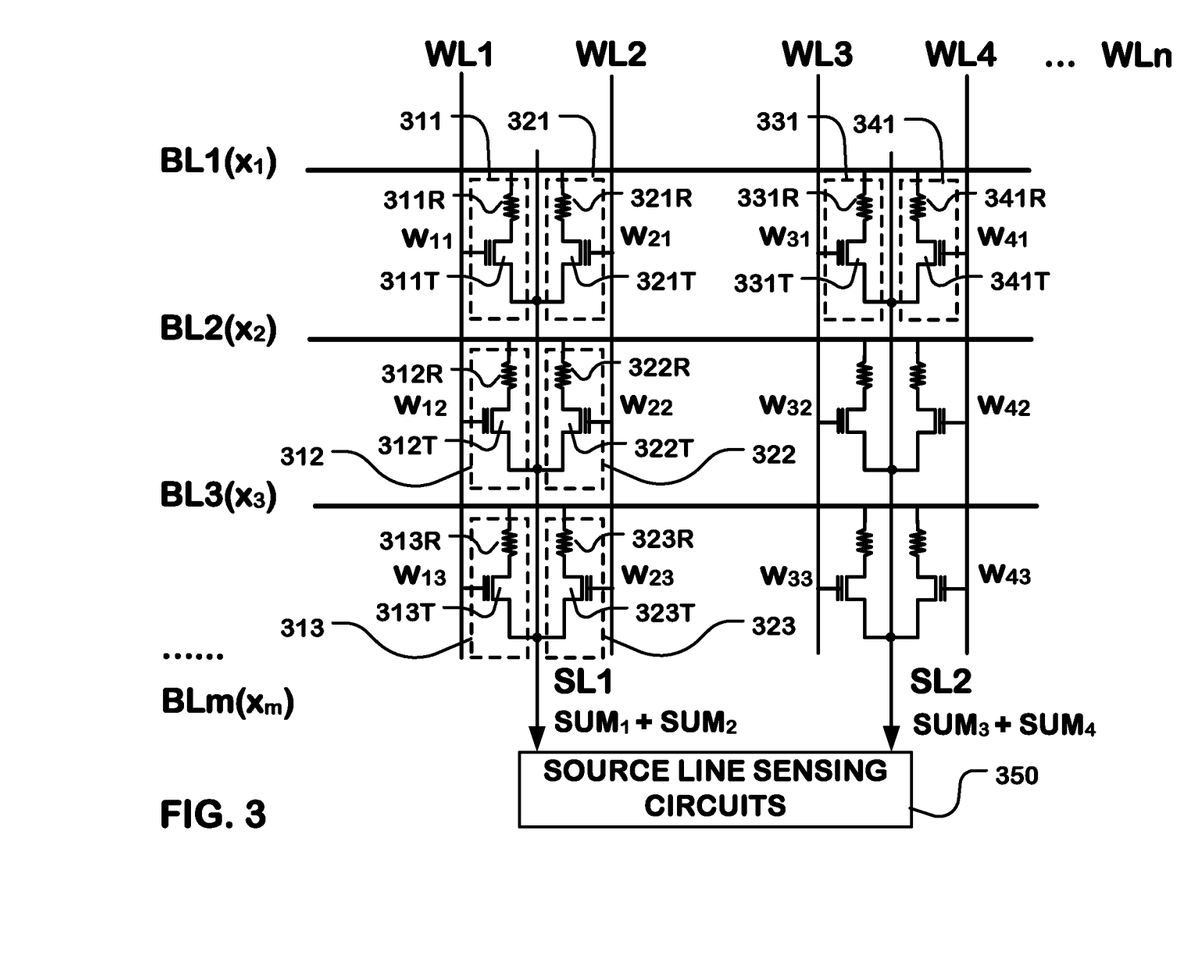
FIG. 3 illustrates an array of resistance cells having a number M of rows and a number N of columns of resistance cells, where a common source line is coupled to resistance cells in two adjacent columns of resistance cells.

In one instance for high speed reading, an array of resistance cells can have a number M=16 rows of resistance cells, and M=16 bit lines providing M=16 signals representing inputs x(m). A maximum value of a predetermined operating bit line to source line voltage can be 2V, and a sensing current range of the sensing circuits can be from a lower value of 0 µA to an upper value of 100 µA. Accordingly a resistance value for resistive elements in the resistance cells in the array can correspond to:

bit line to source line voltage×$M$/upper value of sensing current range=2V×16/100 μA =320×$10^3$ ohms In one instance for lower power consumption, an array of resistance cells can have a number M=32 of rows of resistance cells, and M=32 bit lines providing M=32 signals representing inputs x(m). A maximum value of a predetermined operating bit line to source line voltage can be 1V, and a sensing current range of the sensing circuits can be from a lower value of 0 μA to an upper value of 20 μA. Accordingly a resistance value for resistive elements in the resistance cells in the array can correspond to:

bit line to source line voltage×$M$/upper value of sensing current range=1V×32/20 μA =1.6×$10^6$ ohms FIG. 3 illustrates an array of resistance cells having a number M of rows and a number N of columns of resistance cells, where a common source line is coupled to resistance cells in two adjacent columns of resistance cells. Resistance cells in the array can each comprise a transistor having a threshold, representing a weight factor $W_{nm}$ of the cell, and a resistive element in series with the transistor. Each resistance cell can have a cell resistance having a first value when the transistor is on and a second value when the transistor is off. For instance, a row of resistance cells can include a first resistance cell 311 including a transistor 311T and a resistive element 311R connected in series with the transistor 311T, and a second resistance cell 321 including a transistor 321T and a resistive element 321R connected in series with the transistor 321T.

Embodiments are described that include the resistive elements in the resistance cells in the array, in reference to FIGS. 5A, 5B, 5C, 5D and 5E. Resistive elements in the resistance cells in the array can include materials such as metal oxides, high resistive polysilicon, etc.

A set of source lines (e.g. SL1, SL2) is coupled to the resistance cells in columns of resistance cells, where a common source line is coupled to resistance cells in two adjacent columns of resistance cells. For instance, a common source line SL1 is coupled to resistance cells (e.g. 311-313) in one column of resistance cells and to resistance cells (e.g. 321-323) in an adjacent column of resistance cells. A common source line SL2 is coupled to resistance cells (e.g. 331, 341) in two other adjacent columns of resistance cells.

A set of bit lines (e.g. BL1, BL2, BL3, . . . BLm) is coupled to the resistance cells in respective rows of resistance cells. Signals on the bit lines in the set of bit lines can represent inputs x(m) to the respective rows. A set of word lines (e.g. WL1, WL2, WL3, . . . WLn) is coupled to gates of the transistors in the resistance cells in respective columns of resistance cells. Signals on the word lines in the set of word lines can select respective columns of resistance cells. A set of sensing circuits (e.g. 350) is coupled to respective source lines in the set of source lines (e.g. SL1, SL2).

Current (e.g. $SUM_1$+$SUM_2$) sensed at a first common source line (e.g. SL1) in the set of source lines can represent a first sum of products of the inputs x(m) by respective weight factors $W_{nm}$. Here $SUM_1$ indicates current from resistance cells in one of the two adjacent columns of resistance cells coupled to a first word line WL1 in the set of word lines, and $SUM_2$ indicates current from resistance cells in another of the two adjacent columns of resistance cells coupled to a second word line WL2 in the set of word lines.

Similarly current (e.g. $SUM_3$+$SUM_4$) sensed at a second common source line (e.g. SL2) in the set of source lines can represent a second sum of products of the inputs x(m) by respective weight factors $W_{nm}$. Here $SUM_3$ indicates current from resistance cells in one of the two adjacent columns of resistance cells coupled to a third word line WL3 in the set of word lines, and $SUM_4$ indicates current from resistance cells in another of the two adjacent columns of resistance cells coupled to a fourth word line WL4 in the set of word lines.

A bit line driver (e.g. in block 780, FIG. 7) can apply a predetermined operating bit line to source line voltage, and the sensing circuits can have a sensing current range having an upper value. The first values of the resistances in the resistance cells in the array can have a resistance value at least as high as a resistance determined by the predetermined operating bit line to source line voltage multiplied by the number M of rows and divided by the upper value in the predetermined sensing current range, as further described in reference to FIG. 2.

Figure 4:
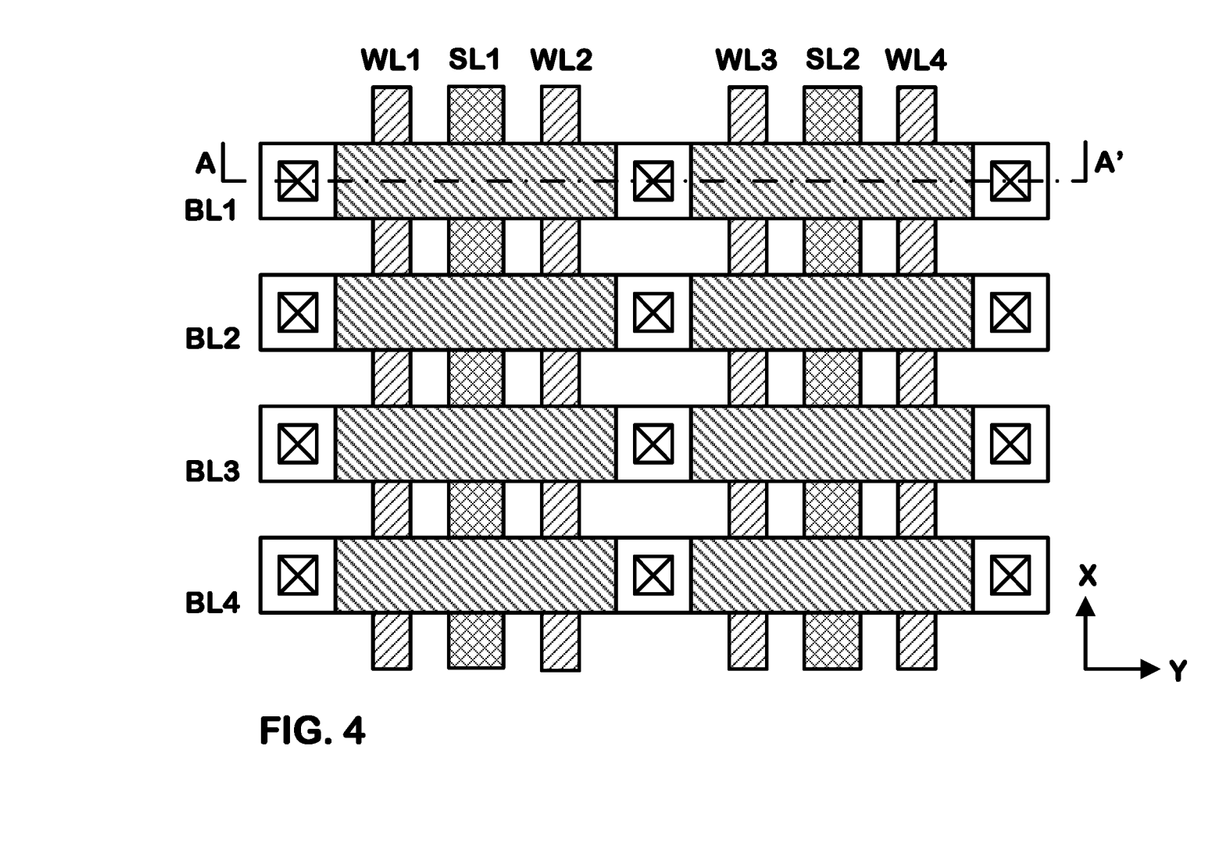
FIG. 4 is a simplified layout view of an array of resistance cells shown in FIG. 3, where a common source line is coupled to resistance cells in two adjacent columns of resistance cells.

FIG. 4 is a simplified layout view of an array of resistance cells shown in FIG. 3, where a common source line is coupled to resistance cells in two adjacent columns of resistance cells. In the example of FIG. 4, a set of bit lines (e.g. BL1, BL2, BL3, BL4) is laid out in a first direction (e.g. Y-direction). A set of source lines (e.g. SL1, SL2) and a set of word lines (e.g. WL1, WL2, WL3, WL4) are laid out in a second direction (e.g. X-direction) orthogonal to the first direction. The set of bit lines is disposed overlying the set of source lines and the set of word lines.

As shown in FIG. 4, a common source line (e.g. SL1) is laid out adjacent and between the first and second word lines (e.g. WL1, WL2). Similarly another common source line (e.g. SL2) is laid out adjacent and between the third and fourth word lines (e.g. WL3, WL4).

The common source line SL1 is coupled to resistance cells (e.g. 311, 312, 313) in a first column of two adjacent columns of resistance cells coupled to the first word line WL1, and coupled to resistance cells (e.g. 321, 322, 323) in a second column of the two adjacent columns of resistance cells coupled to the second word line WL2. The first word line WL1 in the set of word lines is coupled to gates of the transistors in the resistance cells in the first column, and the second word line WL2 in the set of word lines is coupled to gates of the transistors in the resistance cells in the second column.

FIGS. 5A, 5B, 5C, 5D and 5E illustrate example cross-sectional views of a row of resistance cells in a neuromorphic memory array in an integrated circuit device in accordance with embodiments of the present technology. The cross-sectional views are taken along a line A-A' in FIG. 4. Like elements in various embodiments are commonly referred to with like reference numerals.

Figure 5A:
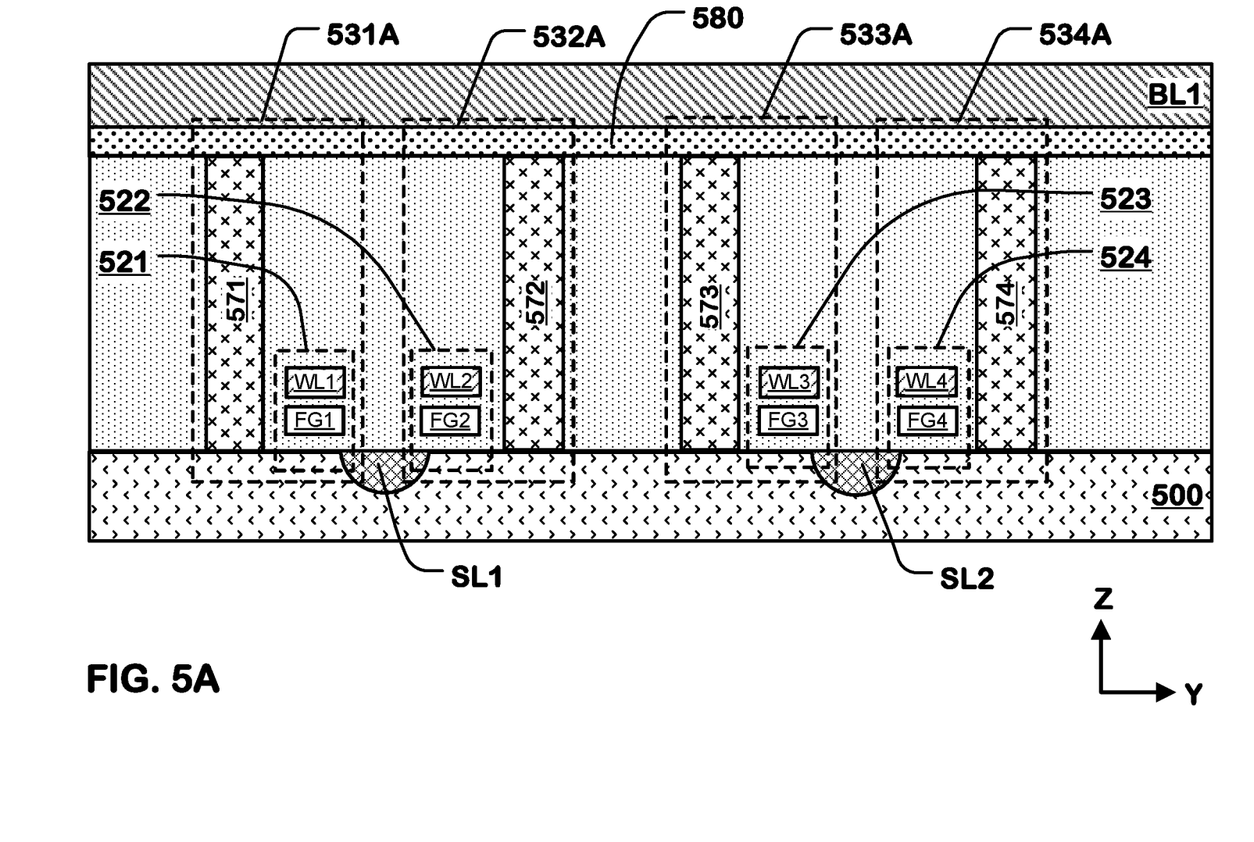
FIGS. 5A, 5B, 5C, 5D and 5E illustrate example cross-sectional views of a row of resistance cells in a neuromorphic memory array in an integrated circuit device in accordance with embodiments of the present technology.

FIG. 5A illustrates a row by four columns of resistance cells in an array of resistance cells having a number M of rows and a number N of columns of resistance cells on a substrate (e.g. 500) in accordance with a first embodiment. Each resistance cell in the row of resistance cells (e.g. 531A, 532A, 533A, 534A) has a transistor (e.g. 521) and a resistive element in series with the transistor. As shown in the example of FIG. 5A, a transistor (e.g. 521) in a resistance cell (e.g. 531A, 532A, 533A, 534A) is a floating gate device having a word line (e.g. WL1, WL2, WL3, WL4) and a floating gate (e.g. FG1, FG2, FG3, FG4), where the word line can act as a control gate over the floating gate. A transistor in a resistance cell can also be a dielectric trapping device, in an alternative embodiment. A first source line (e.g.

SL1) is coupled to the transistors (e.g. 521 and 522) in resistance cells in two adjacent columns of resistance cells. A second source line (e.g. SL2) is coupled to the transistors (e.g. 523 and 524) in resistance cells in two other adjacent columns of resistance cells. A bit line (e.g. BL1) is disposed over and coupled to the resistance cells in the row of resistance cells. Source line sensing circuits (e.g. 350, FIG. 3; 750, FIG. 7) are coupled to the first and second source lines (e.g. SL1, SL2).

Contacts are connected in series with current carrying terminals of the transistors of the resistance cells and corresponding bit lines. The contacts can include interlayer conductors (e.g. 571, 572, 573, 574) comprising a bulk material having a resistivity. The resistive elements can comprise a layer of higher resistivity material in the contacts, the higher resistivity being higher than the resistivity of bulk material of the interlayer conductors. A bulk material as used herein can include conductive materials such as polysilicon having n-type or p-type doping, tungsten, titanium, other metals or metallic alloys and metallic materials such as TiN, TaN, Pt, W, etc.

The bit lines (e.g. BL1) can extend in a horizontal direction (e.g. Y-direction). The interlayer conductors in the contacts can extend in a direction (e.g. Z-direction) orthogonal to the horizontal direction.

In the first embodiment, the resistive elements comprising the layer of higher resistivity material are disposed in a continuous resistive layer (e.g. 580) underlying and contacting the bit lines (e.g. BL1) and overlying and contacting upper ends of the interlayer conductors (e.g. 571, 572, 573, 574).

Figure 5B:
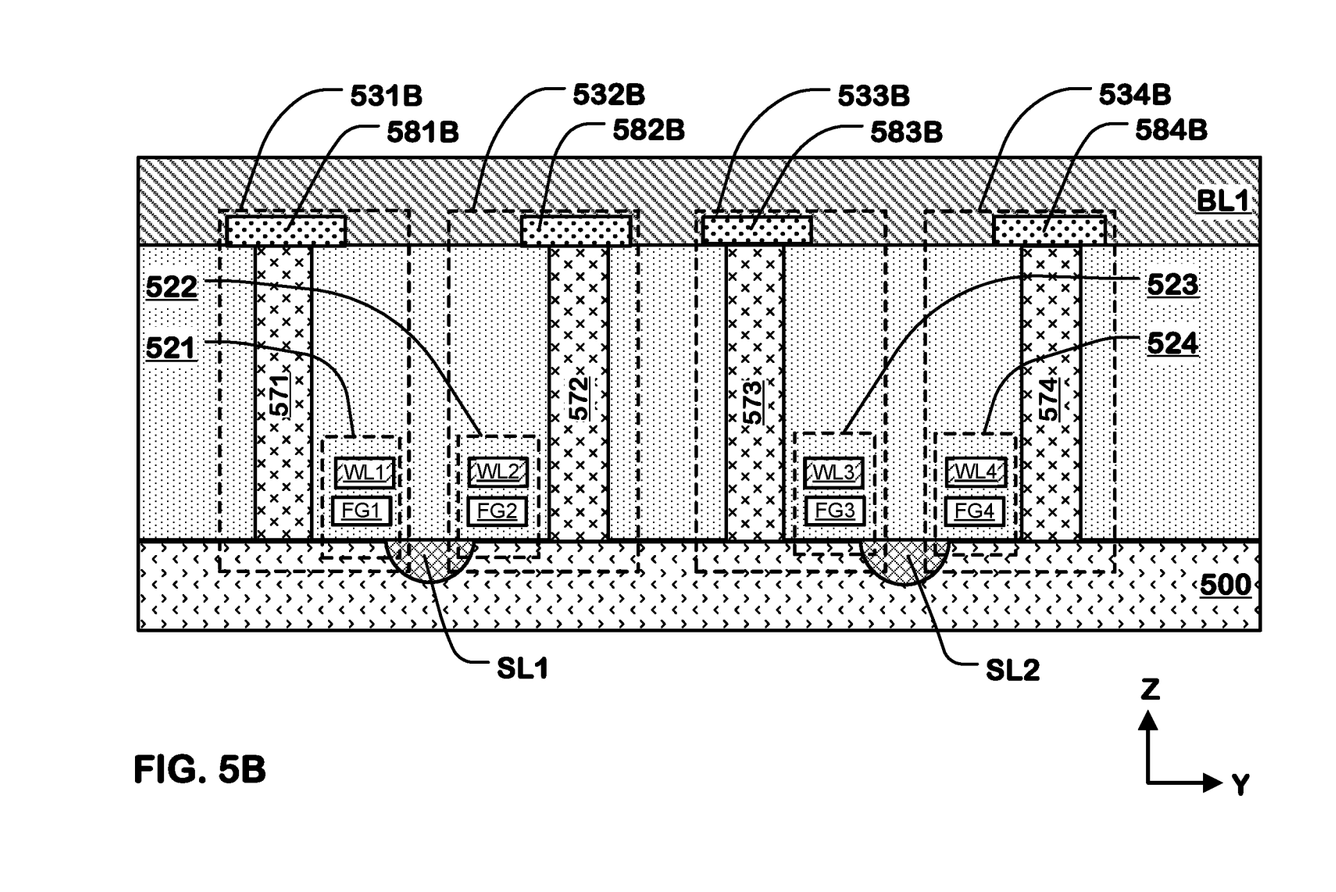

FIG. 5B illustrates a row by four columns of resistance cells in an array of resistance cells having a number M of rows and a number N of columns of resistance cells in accordance with a second embodiment. Each resistance cell in the row of resistance cells (e.g. 531B, 532B, 533B, 534B) has a transistor and a resistive element in series with the transistor. Description about like elements in the first embodiment, including the substrate, the transistors in the resistance cells, the source lines and the bit lines, is applicable to the second embodiment and not repeated here.

One difference is that in the second embodiment, the resistive elements (e.g. 581B, 582B, 583B, 584B) comprising the layer of higher resistivity material are disposed in a patterned resistive layer underlying and contacting the bit lines (e.g. BL1) and overlying and contacting upper ends of the interlayer conductors (e.g. 571, 572, 573, 574). In patterned resistive layer, the resistive elements (e.g. 581B, 582B, 583B, 584B) are physically separated from each other.

Figure 5C:
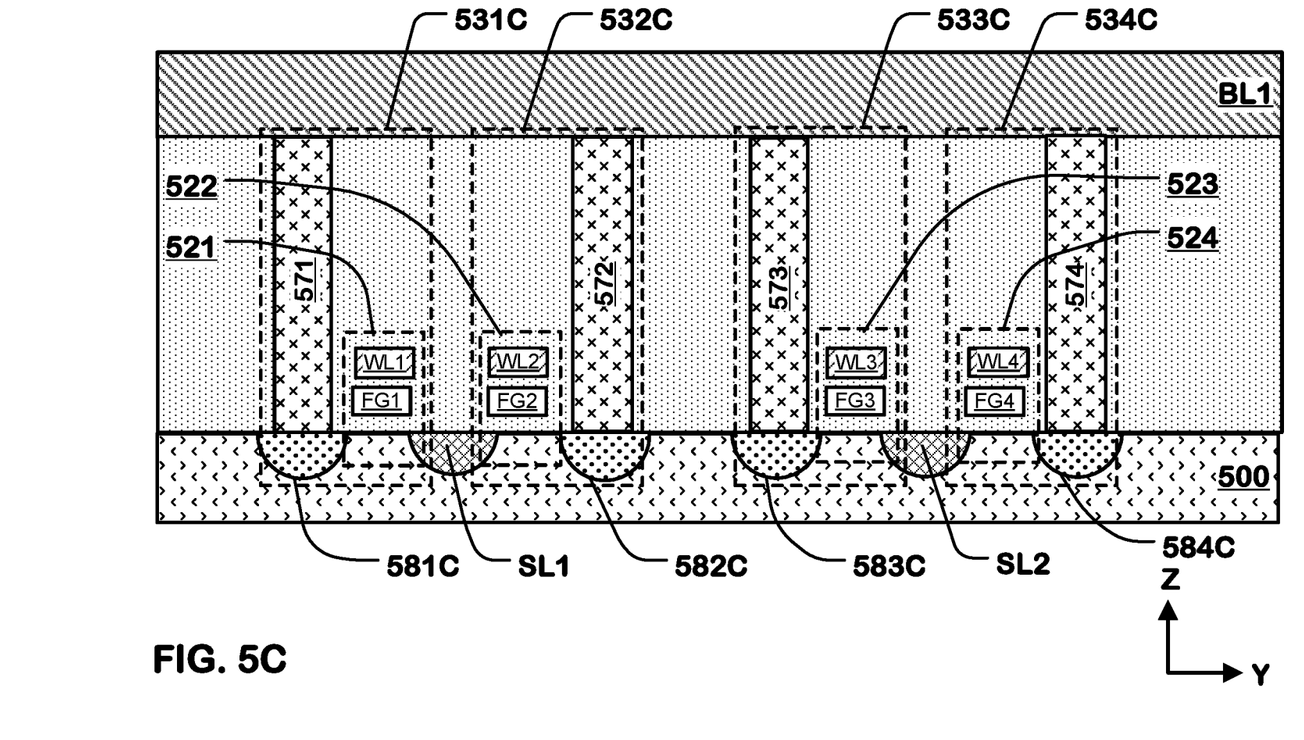

FIG. 5C illustrates a row by four columns of resistance cells in an array of resistance cells having a number M of rows and a number N of columns of resistance cells in accordance with a third embodiment. Each resistance cell in the row of resistance cells (e.g. 531C, 532C, 533C, 534C) has a transistor and a resistive element in series with the transistor. Description about like elements in the first embodiment, including the substrate, the transistors in the resistance cells, the source lines and the bit lines, is applicable to the third embodiment and not repeated here.

One difference is that in the third embodiment, the resistive elements (e.g. 581C, 582C, 583C, 584C) comprising the layer of higher resistivity material are disposed beneath and contacting lower ends of the interlayer conductors (e.g. 571-574) in a substrate. The device comprises peripheral circuits such as sense amplifiers (e.g. 780, FIG. 7) that can have contacts in a substrate. Contacts of the peripheral circuits in a substrate have a lower resistance than the resistive elements comprising the layer of higher resistivity material in the resistance cells in the array of resistance cells.

Figure 5D:
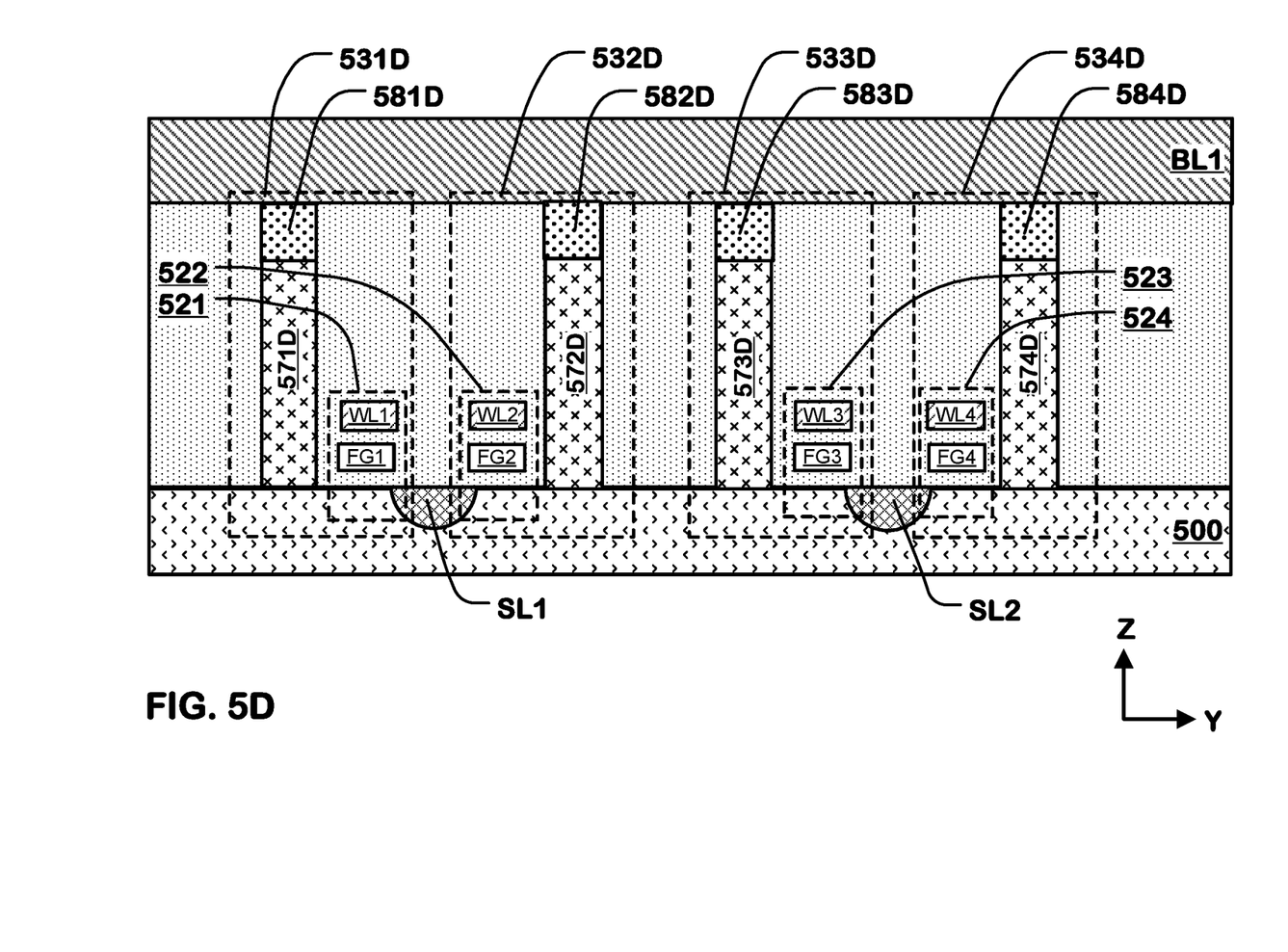

FIG. 5D illustrates a row by four columns of resistance cells in an array of resistance cells having a number M of rows and a number N of columns of resistance cells in accordance with a fourth embodiment. Each resistance cell in the row of resistance cells (e.g. 531D, 532D, 533D, 534D) has a transistor and a resistive element in series with the transistor. Description about like elements in the first embodiment, including the substrate, the transistors in the resistance cells, the source lines and the bit lines, is applicable to the fourth embodiment and not repeated here.

One difference is that in the fourth embodiment, the resistive elements (e.g. 581D, 582D, 583D, 584D) comprising the layer of higher resistivity material are disposed beneath the bit lines (e.g. BL1) and above the interlayer conductors (e.g. 571D, 572D, 573D, 574D). The resistive elements have upper ends disposed beneath and contacting the bit lines, and lower ends disposed above and contacting upper ends of the interlayer conductors.

Figure 5E:
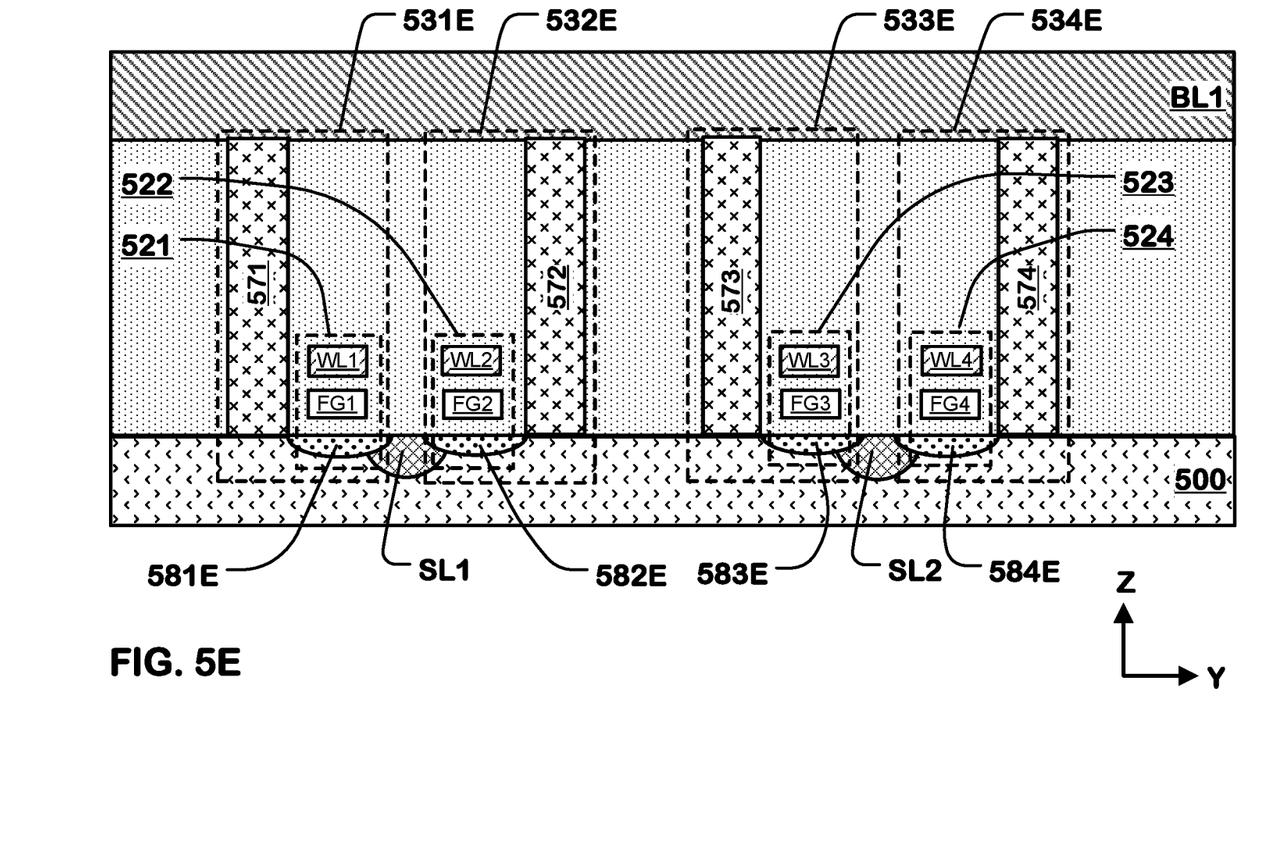

FIG. 5E illustrates a row by four columns of resistance cells in an array of resistance cells having a number M of rows and a number N of columns of resistance cells in accordance with a fifth embodiment. Each resistance cell in the row of resistance cells (e.g. 531E, 532E, 533E, 534E) has a transistor and a resistive element in series with the transistor. Description about like elements in the first embodiment, including the transistors in the resistance cells, the source lines and the bit lines, is applicable to the fifth embodiment and not repeated here.

The device comprises peripheral circuits such as sense amplifiers (e.g. 780, FIG. 7) including transistors having channel resistivities. In the embodiment shown in FIG. 5E, the resistive elements (e.g. 581E, 582E, 583E, 584E) in the resistance cells (e.g. 531E, 532E, 533E, 534E) comprise channel regions of the transistors in the resistance cells on a substrate (e.g. 500), the channel regions of the transistors in the resistance cells having a channel resistivity that is higher than the channel resistivities of the transistors in the peripheral circuits.

In this embodiment, implantation concentration of the channel regions of the transistors in the resistance cells can be changed, so the channel regions of the transistors in the resistance cells can have a channel resistivity that is higher than the channel resistivities of the transistors in the peripheral circuits.

Figure 6:
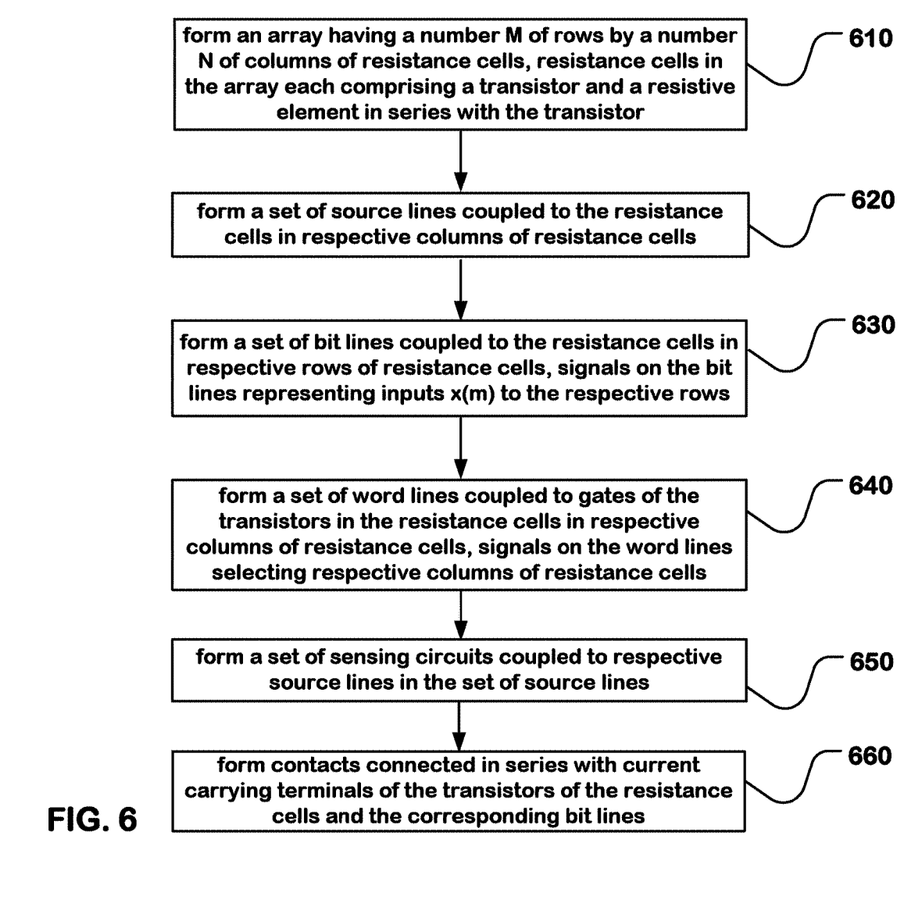
FIG. 6 is a simplified flowchart for manufacturing a neuromorphic memory array in an integrated circuit device in accordance with the present technology.

FIG. 6 is a simplified flowchart for manufacturing a neuromorphic memory array in an integrated circuit device in accordance with the present technology.

At Step 610, an array of resistance cells having a number M of rows and a number N of columns of resistance cells can be formed, where resistance cells in the array can each comprise a transistor having a threshold, representing a weight factor $W_{nm}$ of the cell, and a resistive element in series with the transistor. Each resistance cell can have a cell resistance having a first value when the transistor is on and a second value when the transistor is off. In one embodiment, the transistors in the resistance cells in the array of resistance cells can include floating gate devices. In an alternative embodiment, the transistors in the resistance cells in the array of resistance cells can include dielectric charge trapping devices.

At Step 620, a set of source lines can be formed that are coupled to the resistance cells in respective columns of resistance cells. In one embodiment, source lines in the set of source lines can include a common source line coupled to resistance cells in two adjacent columns of resistance cells in the array of resistance cells. At Step 630, a set of bit lines can be formed that are coupled to the resistance cells in respective rows of resistance cells. Signals on the bit lines in the set of bit lines can represent inputs x(m) to the respective rows. At Step 640, a set of word lines can be formed that are coupled to gates of the transistors in the resistance cells in respective columns of resistance cells. Signals on the word lines in the set of word lines can select respective columns of resistance cells.

At Step 650, a set of sensing circuits can be formed that are coupled to respective source lines in the set of source lines. Current sensed at a particular source line in the set of source lines can represent a sum of products of the inputs x(m) by respective weight factors $W_{nm}$.

A bit line driver can apply a predetermined operating bit line to source line voltage, and the sensing circuits can have a sensing current range having an upper value, wherein the first values of the resistances in the resistance cells in the array have a resistance value at least as high as a resistance determined by the predetermined operating bit line to source line voltage multiplied by the number M of rows and divided by the upper value in the predetermined sensing current range. The first value of the cell resistance of the resistance cells in the array can be greater than 100 kilo-ohms.

At Step 660, contacts can be formed that are connected in series with current carrying terminals of the transistors of the resistance cells and corresponding bit lines. The contacts include interlayer conductors comprising a bulk material having a resistivity. The resistive elements in the resistance cells in the neuromorphic array comprise a layer of higher resistivity material in the contacts, the higher resistivity being higher than the resistivity of bulk material of the interlayer conductors.

Embodiments are described that include the resistive elements in the resistance cells in the neuromorphic array, in reference to FIGS. 5A, 5B, 5C, 5D and 5E. Order of steps shown in the flowchart does not indicate order of executions of the steps.

FIG. 7 is a simplified chip block diagram of an integrated circuit device 700 including a neuromorphic memory array 760 of resistance cells having a number M of rows and a number N of columns of resistance cells. Each resistance cell in the array comprises a transistor having a threshold, representing a weight factor $W_{nm}$ of the cell, and a resistive element in series with the transistor. Each resistance cell has a cell resistance having a first value when the transistor is on and a second value when the transistor is off.

The integrated circuit device 700 includes a set of source lines 755 coupled to the resistance cells in respective columns of resistance cells, and a set of bit lines 765 coupled to the resistance cells in respective rows of resistance cells, signals on the bit lines in the set of bit lines representing inputs x(m) to the respective rows. Source lines in the set of source lines can include a common source line coupled to resistance cells in two adjacent columns of resistance cells in the array of resistance cells.

A set of word lines is coupled to gates of the transistors in the resistance cells in respective columns of resistance cells, signals on the word lines in the set of word lines selecting respective columns of resistance cells. Word line drivers 740 are coupled to a set of word lines 745, which in turn are coupled to gates of the transistors in the resistance cells in respective columns of resistance cells in the array.

A set of sensing circuits 750 is coupled to respective source lines in the set of source lines. For sum-of-products operations using the array, the source line sensing circuits 750 can sense current at source lines 755 from the memory array 760. Currents sensed at a particular source line in the set of source lines can represent a sum of products of the inputs x(m) by respective weight factors $W_{nm}$. Sensed data from the source line sensing circuits 750 are supplied via data lines 753 to data buffer 790, which is in turn coupled to input/output circuits 791 via a data path 793.

Bit line drivers in circuits 780 are coupled to the column decoder 770 via lines 775, and are in turn coupled to bit lines 765. For sum-of-products operations using the array, bit line drivers in circuits 780 can produce an input x(m) for each selected bit line. A bit line driver can apply a predetermined operating bit line to source line voltage. The sensing circuits can have a sensing current range having an upper value. The first values of the resistances in the resistance cells in the array can have a resistance value at least as high as a resistance determined by the predetermined operating bit line to source line voltage multiplied by the number M of rows and divided by the upper value in the predetermined sensing current range. The first value of the cell resistance of the resistance cells in the array can be greater than 100 kilo-ohms.

Addresses are supplied on bus 730 from control logic (controller) 710 to column decoder 770 and word line drivers 740. Voltage sensing sense amplifiers in circuits 780 are coupled to the column decoder 770 via lines 775, and are in turn coupled to buffer circuits 790. Buffer circuits 790 can be coupled with the sense amplifiers in circuits 780 to store program data for programming of the transistors in the resistance cells in the array. Also, the control logic 710 can include circuits for selectively applying program voltages to the transistors in the resistance cells in the array in response to the program data values in the buffer circuits 790.

For memory read operations, sensed data from the sense amplifiers in circuits 780 are supplied via second data lines 785 to data buffer 790, which is in turn coupled to input/output circuits 791 via a data path 793.

Input/output circuits 791 drive the data to destinations external to the integrated circuit device 700. Input/output data and control signals are moved via data bus 705 between the input/output circuits 791, the control logic 710 and input/output ports on the integrated circuit device 700 or other data sources internal or external to the integrated circuit device 700, such as a general purpose processor or special purpose application circuitry, or a combination of modules providing system-on-a-chip functionality supported by the memory array 760.

In the example shown in FIG. 7, control logic 710, using a bias arrangement state machine, controls the application of supply voltages generated or provided through the voltage supply or supplies in block 720, for sum-of-products operations. The control logic 710 is coupled to the buffer 790 and the memory array 760.

The control logic 710 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device comprising:
an array of resistance cells having a number M of rows and a number N of columns of resistance cells, resistance cells in the array each comprising a transistor having a threshold representing a weight factor $W_{nm}$ of the cell, and a resistive element in series with the transistor, the cell having a cell resistance having a first value when the transistor is on and a second value when the transistor is off;
a set of source lines coupled to the resistance cells in respective columns of resistance cells;
a set of bit lines coupled to the resistance cells in respective rows of resistance cells, signals on the bit lines in the set of bit lines representing inputs x(m) to the respective rows;
a set of word lines coupled to gates of the transistors in the resistance cells in respective columns of resistance cells, signals on the word lines in the set of word lines selecting respective columns of resistance cells; and
a set of sensing circuits coupled to respective source lines in the set of source lines,
wherein current sensed at a particular source line in the set of source lines represents a sum of products of the inputs x(m) by respective weight factors $W_{nm}$.

2. The device of claim 1, wherein a bit line driver applies a predetermined operating bit line to source line voltage, and the sensing circuits have a sensing current range having an upper value, wherein the first values of the resistances in the resistance cells in the array have a resistance value at least as high as a resistance determined by the predetermined operating bit line to source line voltage multiplied by the number M of rows and divided by the upper value in the predetermined sensing current range.

3. The device of claim 1, wherein the first value of the cell resistance of the resistance cells in the array is greater than 100 kilo-ohms.

4. The device of claim 1, wherein source lines in the set of source lines include a common source line coupled to resistance cells in two adjacent columns of resistance cells in the array of resistance cells.

5. The device of claim 1, comprising:
contacts connected in series with current carrying terminals of the transistors of the resistance cells and corresponding bit lines, the contacts including interlayer conductors comprising a bulk material having a resistivity, and wherein the resistive elements comprise a layer of higher resistivity material in the contacts, the higher resistivity being higher than the resistivity of bulk material of the interlayer conductors.

6. The device of claim 5, wherein the resistive elements comprising the layer of higher resistivity material are disposed in a continuous resistive layer underlying and contacting the bit lines and overlying and contacting upper ends of the interlayer conductors.

7. The device of claim 5, wherein the resistive elements comprising the layer of higher resistivity material are disposed in a patterned resistive layer underlying and contacting the bit lines and overlying and contacting upper ends of the interlayer conductors.

8. The device of claim 5, wherein the resistive elements comprising the layer of higher resistivity material are disposed beneath and contacting lower ends of the interlayer conductors in a substrate.

9. The device of claim 5, wherein the resistive elements comprising the layer of higher resistivity material are disposed beneath the bit lines and above the interlayer conductors, the resistive elements having upper ends disposed beneath and contacting the bit lines, and lower ends disposed above and contacting upper ends of the interlayer conductors.

10. The device of claim 1, comprising peripheral circuits including transistors having channel resistivities, wherein the resistive elements in the resistance cells comprise channel regions of the transistors in the resistance cells on a substrate, the channel regions of the transistors in the resistance cells having a channel resistivity that is higher than the channel resistivities of the transistors in the peripheral circuits.

11. A method of manufacturing a memory device, comprising:
forming an array of resistance cells having a number M of rows and a number N of columns of resistance cells, resistance cells in the array each comprising a transistor having a threshold, representing a weight factor $W_{nm}$ of the cell, and a resistive element in series with the transistor, the cell having a cell resistance having a first value when the transistor is on and a second value when the transistor is off;
forming a set of source lines coupled to the resistance cells in respective columns of resistance cells;
forming a set of bit lines coupled to the resistance cells in respective rows of resistance cells, signals on the bit lines in the set of bit lines representing inputs x(m) to the respective rows;
forming a set of word lines coupled to gates of the transistors in the resistance cells in respective columns of resistance cells, signals on the word lines in the set of word lines selecting respective columns of resistance cells; and
forming a set of sensing circuits coupled to respective source lines in the set of source lines,
wherein current sensed at a particular source line in the set of source lines represents a sum of products of the inputs x(m) by respective weight factors $W_{nm}$.

12. The method of claim 11, wherein a bit line driver applies a predetermined operating bit line to source line voltage, and the sensing circuits have a sensing current range having an upper value, wherein the first values of the resistances in the resistance cells in the array have a resistance value at least as high as a resistance determined by the predetermined operating bit line to source line voltage multiplied by the number M of rows and divided by the upper value in the predetermined sensing current range.

13. The method of claim 11, wherein the first value of the cell resistance of the resistance cells in the array is greater than 100 kilo-ohms.

14. The method of claim 11, wherein source lines in the set of source lines include a common source line coupled to resistance cells in two adjacent columns of resistance cells in the array of resistance cells.

15. The method of claim 11, comprising:
forming contacts connected in series with current carrying terminals of the transistors of the resistance cells and corresponding bit lines, the contacts including interlayer conductors comprising a bulk material having a resistivity, and wherein the resistive elements comprise a layer of higher resistivity material in the contacts, the higher resistivity being higher than the resistivity of bulk material of the interlayer conductors.

16. The method of claim 15, wherein the resistive elements comprising the layer of higher resistivity material are disposed in a continuous resistive layer underlying and contacting the bit lines and overlying and contacting upper ends of the interlayer conductors.

17. The method of claim 15, wherein the resistive elements comprising the layer of higher resistivity material are disposed in a patterned resistive layer underlying and contacting the bit lines and overlying and contacting upper ends of the interlayer conductors.

18. The method of claim 15, wherein the resistive elements comprising the layer of higher resistivity material are disposed beneath and contacting lower ends of the interlayer conductors in a substrate.

19. The method of claim 15, wherein the resistive elements comprising the layer of higher resistivity material are disposed beneath the bit lines and above the interlayer conductors, the resistive elements having upper ends disposed beneath and contacting the bit lines, and lower ends disposed above and contacting upper ends of the interlayer conductors.

20. The method of claim 11, wherein the memory device comprises peripheral circuits including transistors having channel resistivities, and the resistive elements in the resistance cells comprise channel regions of the transistors in the resistance cells on a substrate, the channel regions of the transistors in the resistance cells having a channel resistivity that is higher than the channel resistivities of the transistors in the peripheral circuits.

* * * * *